United States Patent
van Nieuwkerk et al.

(10) Patent No.: US 9,866,959 B2
(45) Date of Patent: Jan. 9, 2018

(54) SELF-BIASING OUTPUT BOOSTER AMPLIFIER AND USE THEREOF

(71) Applicant: Sonion Nederland B.V., Hoofddorp (NL)

(72) Inventors: Michiel van Nieuwkerk, Hoofddorp (NL); Yang Gao, Hoofddorp (NL)

(73) Assignee: Sonion Nederland B.V., Hoofddorp (NL)

( * ) Notice: Subject to any disclaimer, the term of this patent is extended or adjusted under 35 U.S.C. 154(b) by 0 days.

(21) Appl. No.: 15/415,174

(22) Filed: Jan. 25, 2017

(65) Prior Publication Data

US 2017/0215006 A1    Jul. 27, 2017

(30) Foreign Application Priority Data

Jan. 25, 2016 (EP) ..................................... 16152518

(51) Int. Cl.
| | | |
|---|---|---|
| H04R 3/00 | (2006.01) | |
| H03F 3/185 | (2006.01) | |
| H04R 19/04 | (2006.01) | |

(52) U.S. Cl.
CPC ............. *H04R 3/005* (2013.01); *H03F 3/185* (2013.01); *H03F 2200/03* (2013.01); *H03F 2200/171* (2013.01); *H04R 19/04* (2013.01)

(58) Field of Classification Search
CPC ................. H03F 1/302; H03F 2200/03; H03F 2200/171; H03F 3/185; H04R 19/04; H04R 3/005
See application file for complete search history.

(56) References Cited

U.S. PATENT DOCUMENTS

| | | |
|---|---|---|
| 6,788,796 B1 | 9/2004 | Miles et al. |
| 6,831,577 B1 | 12/2004 | Furst |
| 6,853,290 B2 | 2/2005 | Jorgensen et al. |
| 6,859,542 B2 | 2/2005 | Johannsen et al. |
| 6,888,408 B2 | 5/2005 | Furst et al. |
| 6,914,992 B1 | 7/2005 | van Halteren et al. |

(Continued)

FOREIGN PATENT DOCUMENTS

GB    2266021 A    10/1993

OTHER PUBLICATIONS

European Search Report corresponding to European Patent Application No. 16152518, European Patent Office, dated Jul. 7, 2016; (2 pages).

(Continued)

*Primary Examiner* — Mohammad Islam
(74) *Attorney, Agent, or Firm* — Nixon Peabody LLP

(57) ABSTRACT

A self-biasing output booster amplifier having an input amplifier stage, an output amplifier stage being operatively connected to an output of the input amplifier stage, and first and second current copying circuits. The second current copying circuit is biased from an output of the self-biasing output booster amplifier. The first and second current copying circuits are configured to copy at least a portion of the current through the output amplifier stage. The sum of the output of the second current copying circuit and the output of the output amplifier stage provides the output current of the self-biasing output booster amplifier, Finally, the input amplifier stage is biased from the output of the second current copying.

20 Claims, 12 Drawing Sheets a)

b)

(56) References Cited

U.S. PATENT DOCUMENTS

| | | |
|---|---|---|
| 6,919,519 B2 | 7/2005 | Ravnkilde et al. |
| 6,927,634 B1 * | 8/2005 | Kobayash ................ H03F 3/64 330/296 |
| 6,930,259 B1 | 8/2005 | Jorgensen et al. |
| 6,943,308 B2 | 9/2005 | Ravnkilde et al. |
| 6,974,921 B2 | 12/2005 | Jorgensen et al. |
| 7,008,271 B2 | 3/2006 | Jorgensen |
| 7,012,200 B2 | 3/2006 | Moller |
| 7,062,058 B2 | 6/2006 | Steeman et al. |
| 7,062,063 B2 | 6/2006 | Hansen et al. |
| 7,072,482 B2 | 7/2006 | Van Doorn et al. |
| 7,088,839 B2 | 8/2006 | Geschiere et al. |
| 7,110,560 B2 | 9/2006 | Stenberg |
| 7,136,496 B2 | 11/2006 | van Halteren et al. |
| 7,142,682 B2 | 11/2006 | Mullenbom et al. |
| 7,181,035 B2 | 2/2007 | van Halteren et al. |
| 7,190,803 B2 | 3/2007 | van Halteren |
| 7,206,428 B2 | 4/2007 | Geschiere et al. |
| 7,221,767 B2 | 5/2007 | Mullenborn et al. |
| 7,221,769 B1 | 5/2007 | Jorgensen |
| 7,227,968 B2 | 6/2007 | van Heltren et al. |
| 7,239,714 B2 | 7/2007 | de Blok et al. |
| 7,245,734 B2 | 7/2007 | Niederdraenk |
| 7,254,248 B2 | 8/2007 | Johannsen et al. |
| 7,286,680 B2 | 10/2007 | Steeman et al. |
| 7,292,700 B1 | 11/2007 | Engbert et al. |
| 7,292,876 B2 | 11/2007 | Bosh et al. |
| 7,336,794 B2 | 2/2008 | Furst et al. |
| 7,365,604 B2 * | 4/2008 | Luo ........................ H03F 1/30 330/285 |
| 7,376,240 B2 | 5/2008 | Hansen et al. |
| 7,403,630 B2 | 7/2008 | Jorgensen et al. |
| 7,415,121 B2 | 8/2008 | Mögelin et al. |
| 7,425,196 B2 | 9/2008 | Jorgensen et al. |
| 7,460,681 B2 | 12/2008 | Geschiere et al. |
| 7,466,835 B2 | 12/2008 | Stenberg et al. |
| 7,492,919 B2 | 2/2009 | Engbert et al. |
| 7,548,626 B2 | 6/2009 | Stenberg et al. |
| 7,657,048 B2 | 2/2010 | van Halteren et al. |
| 7,684,575 B2 | 3/2010 | van Halteren et al. |
| 7,706,561 B2 | 4/2010 | Wilmink et al. |
| 7,715,583 B2 | 5/2010 | Van Halteren et al. |
| 7,728,237 B2 | 6/2010 | Pedersen et al. |
| 7,809,151 B2 | 10/2010 | Van Halteren et al. |
| 7,822,218 B2 | 10/2010 | Van Halteren |
| 7,899,203 B2 | 3/2011 | Van Halteren et al. |
| 7,912,240 B2 | 3/2011 | Madaffari et al. |
| 7,946,890 B1 | 5/2011 | Bondo et al. |
| 7,953,241 B2 | 5/2011 | Jorgensen et al. |
| 7,961,899 B2 | 6/2011 | Van Halteren et al. |
| 7,970,161 B2 | 6/2011 | van Halteren |
| 8,098,854 B2 | 1/2012 | van Halteren et al. |
| 8,101,876 B2 | 1/2012 | Andreasen et al. |
| 8,103,039 B2 | 1/2012 | van Halteren et al. |
| 8,160,290 B2 | 4/2012 | Jorgensen et al. |
| 8,170,249 B2 | 5/2012 | Halteren |
| 8,189,804 B2 | 5/2012 | Hruza |
| 8,189,820 B2 | 5/2012 | Wang |
| 8,223,996 B2 | 7/2012 | Beekman et al. |
| 8,233,652 B2 | 7/2012 | Jorgensen et al. |
| 8,259,963 B2 | 9/2012 | Stenberg et al. |
| 8,259,976 B2 | 9/2012 | van Halteren |
| 8,259,977 B2 | 9/2012 | Jorgensen et al. |
| 8,280,082 B2 | 10/2012 | van Halteren et al. |
| 8,284,966 B2 | 10/2012 | Wilk et al. |
| 8,313,336 B2 | 11/2012 | Bond et al. |
| 8,315,422 B2 | 11/2012 | van Halteren et al. |
| 8,331,595 B2 | 12/2012 | van Halteren |
| 8,369,552 B2 | 2/2013 | Engbert et al. |
| 8,379,899 B2 | 2/2013 | van Halteren et al. |
| 8,509,468 B2 | 8/2013 | van Halteren et al. |
| 8,526,651 B2 | 9/2013 | Lafort et al. |
| 8,526,652 B2 | 9/2013 | Ambrose et al. |
| 2002/0067209 A1 * | 6/2002 | Luo ........................ H03F 1/302 330/296 |
| 2009/0302824 A1 * | 12/2009 | Kim ........................ G05F 3/24 323/313 |
| 2011/0182453 A1 | 7/2011 | van Hal et al. |
| 2011/0189880 A1 | 8/2011 | Bondo et al. |
| 2011/0299708 A1 | 12/2011 | Bondo et al. |
| 2011/0299712 A1 | 12/2011 | Bondo et al. |
| 2011/0311069 A1 | 12/2011 | Ambrose et al. |
| 2012/0014548 A1 | 1/2012 | van Halteren |
| 2012/0027245 A1 | 2/2012 | van Halteren et al. |
| 2012/0140966 A1 | 6/2012 | Mocking et al. |
| 2012/0155683 A1 | 6/2012 | van Halteren |
| 2012/0155694 A1 | 6/2012 | Reeuwijk et al. |
| 2012/0250898 A1 | 10/2012 | Wang et al. |
| 2012/0255805 A1 | 10/2012 | van Halteren et al. |
| 2013/0028451 A1 | 1/2013 | de Roo |
| 2013/0136284 A1 | 5/2013 | van Hal et al. |
| 2013/0142370 A1 | 6/2013 | Engbert et al. |
| 2013/0163799 A1 | 6/2013 | Van Halteren |
| 2013/0195295 A1 | 8/2013 | van Halteren et al. |
| 2014/0097906 A1 | 4/2014 | Jennings et al. |

OTHER PUBLICATIONS

Kenney et al., An Enhanced Slew Rate Source Follower, XP000496306, 8107 IEEE Journal of Solid-State Circuits (Feb. 30, 1995), No. 2, New York, US; dated 1995; (3 pages).

* cited by examiner a)

SELF-BIASING OUTPUT BOOSTER AMPLIFIER AND USE THEREOF

CROSS-REFERENCE TO RELATED APPLICATION

This application claims the benefit of European Patent Application Serial No. 16152518.3, filed Jan. 25, 2016, which is incorporated herein by reference in its entirety.

FIELD OF THE INVENTION

The present invention relates to a self-biasing output booster amplifier and the use thereof in connection with for example a sensor module.

BACKGROUND OF THE INVENTION

Various electronic filter arrangements for processing signals in hearing devices have been suggested over the years. Examples of such arrangements can for example be found in US 2014/0097906 A1, U.S. Pat. No. 6,888,408 B1, GB 2 266 021 A as well as the paper titled "An enhanced slew rate source follower", IEEE Journal of solid-state circuits (Vol 30, No 2, 1 Feb. 1995, pages 144-146) by Kenney J G et al.

Referring now to US 2014/0097906 A1 an amplifier having a high-pass filter is suggested. However, this high-pass filter has a major drawback in that its cut-off frequency is not constant with an input signal level to the amplifier. Thus, when a large low frequency signal is introduced to the input the amplifier loses partly its high-pass filter function. As a result the low frequency input signal is feed through to the output of the amplifier without the predetermined and constant attenuation. This lack of attenuation will inevitably result in a poor sound quality in the low-frequency range.

U.S. Pat. No. 6,888,408 B1 discloses a high-pass filter suffering from the same problem due to a resistance biasing at the input stage of the amplifier, i.e. bias current varies with output signal level. Moreover, the output noise level of the arrangement suggested in U.S. Pat. No. 6,888,408 B1 is high, because a common source n-channel metal-oxide-semiconductor (NMOS) output stage is used instead of a common source p-channel metal-oxide-semiconductor (PMOS) transistor.

The above-mentioned disadvantages regarding the high-pass filter also apply to GB 2 266 021 A and the paper of Kenney J G et al.

Thus, there seems to be severe disadvantages associated with the high-pass filters suggested in the above-mentioned prior art references.

It may be seen as an object of embodiments of the present invention to provide an amplifier topology that facilitates incorporation of a stable filter stage having a frequency response which is essentially unaffected by a signal level arriving at an input amplifier stage of the amplifier.

It may be seen as a further object of embodiments of the present invention to apply the amplifier in an advantageous configuration in a microphone unit in order to obtain a dual omni-output signal.

SUMMARY OF INVENTION

The above-mentioned objects are complied with by providing, in a first aspect, a self-biasing output booster amplifier comprising an input amplifier stage,
an output amplifier stage being operatively connected to an output of the input amplifier stage, and
first and second current copying circuits, wherein the second current copying circuit is biased from an output of the self-biasing output booster amplifier
wherein the first and second current copying circuits are configured to copy at least a portion of the current through the output amplifier stage, and
wherein the sum of the output of the second current copying circuit and the output of the output amplifier stage provides the output current of the self-biasing output booster amplifier, and
wherein the input amplifier stage is biased from the output of the second current copying.

The self-biasing concept of the output booster amplifier of the present invention facilitates that the output booster amplifier may advantageously be used in two wire applications. In the present context the term "self-biasing" implies that the output booster amplifier will balance its internal bias currents through its components itself via a negative feedback path.

As addressed above the output amplifier stage may be operatively connected to an output of the input amplifier stage. The term "operatively" should be understood as either directly connected or connected via for example a filter stage, such as a via a high-pass filter.

The self-biasing output booster amplifier according to the present invention is advantageous over prior art systems in various ways. Firstly, the self-biasing output booster amplifier of the present invention may apply a fixed external bias current source. This facilitates use in particular in relation to two wire amplifier configurations. The circuit topology of the self-biasing output booster amplifier facilitates implementation and integration of a stabile high pass filter. Due to the circuit topology a low frequency signal at the input stage output will have less feed through to the output node. The self-biasing output booster amplifier currents flow through the current mirrors and the output stage and contribute directly to the output signal level. No other fixed current source is required inside the self-biasing output booster amplifier circuit. This may reduce the supply current efficiency which is ideal for lower power applications.

The topology of the self-biasing output booster amplifier of the present invention is advantageous in that its frequency response is essentially unaffected by the level of an input signal applied to an input amplifier stage of the self-biasing output booster amplifier.

The self-biasing output booster amplifier of the present invention may in principle handle any kind of input signal, including input signals from various types of sensors, such as vibration sensors, pressure sensors, microphones etc.

The first and second current copying circuits may be configured to copy the total current through the output amplifier stage. In addition, the input amplifier stage may be fully biased from the output of the second current copying. The self-biasing output booster amplifier may further comprise a power supply comprising a bias current source.

The output amplifier stage of the self-biasing output booster amplifier may comprise a source follower. The source follower may comprise a transistor, such as a PMOS or a NMOS type transistor. It should be noted however, that the source follower may be replaced by other circuit topologies, such as other types of amplifier states, operational amplifier configurations etc.

The input amplifier stage may comprise at least one transistor being adapted to be operated as a source follower stage in order to buffer an incoming signal from the associated sensor, such as vibration sensors, pressure sensors, microphones etc. The at least one transistor may be a PMOS or a NMOS transistor.

The current copying circuit may comprise a current mirror circuit for sensing a drain current from a source follower, and wherein a copy of the drain current is applied to control one or more currents through one or more current sources of the self-biasing output booster amplifier. Thus, a drain current of the output amplifier stage may be copied and subsequent applied to control one or more currents through one or more current sources of the self-biasing output booster amplifier. Again, the one or more current sources may comprise transistor-based circuit topologies.

As indicated above the self-biasing output booster amplifier may further comprise an input amplifier stage adapted to receive a signal from an associated sensor. Moreover, the self-biasing output booster amplifier may further comprise a filter stage adapted to filter signals from the input amplifier stage. The filter stage may comprise a high-pass filter, a low-pass filter, a band-pass filter or a notch filter. The presence of the current copying circuit ensures that the frequency response of the filter stage, and thereby the frequency response of the self-biasing output booster amplifier as a whole, is essentially unaffected by the level of an input signal applied to the input amplifier stage.

The output amplifier stage of the self-biasing output booster amplifier may further comprise a voltage level shifting arrangement, such as a resistor. The resistance of such a resistor may be selected in view of an acceptable noise level. In fact the voltage level shifting arrangement may be considered as forming an integral part of the output amplifier stage.

In a second aspect the present invention relates to a summing circuit for processing signals from at least two associated sensors, said summing circuit comprising a plurality of self-biasing output booster amplifiers according to the first aspect of the present invention. The number of applied self-biasing output booster amplifiers may in principle be arbitrary. Typically, the number of self-biasing output booster amplifiers will however be smaller than 10, such as smaller than 8, such as smaller than 6. The at least two associated sensors may comprise at least two microphone membranes, such as MEMS membranes and/or electret membranes.

In a third aspect the present invention relates to a sensor module comprising at least one summing circuit according to the second aspect, and at least one sensor being operatively connected thereto. The at least one sensor may be selected from the group consisting of: microphones, telecoils and vibration sensors.

In a fourth aspect the present invention relates to a microphone module comprising at least one summing circuit according to the second aspect, and at least one microphone cartridge being operatively connected thereto, wherein the at least one microphone cartridge may comprise a MEMS cartridge and/or an electret cartridge.

In a fifth aspect the present invention relates to a personal assisting device comprising a sensor module according to the third aspect, said personal assisting device comprising a hearing aid being selected from the group consisting of: behind-the-ear, in-the-ear, in-the-canal and completely-in-the-canal.

In a sixth aspect the present invention relates to a method for operating a self-biasing output booster amplifier, the method comprising the steps of copying a current from an output amplifier stage, and control one or more currents through one or more current sources of the self-biasing output booster amplifier using the copied current. The copied current may be a drain current from a source follower. The output amplifier stage may comprise a first and a second gain. The first and second gains may be generated by respective first and second amplifier stages. Moreover, the first and second gains being adjustable, such as adjustable by hard-wiring on beforehand and/or adjustable on-the-fly, i.e. during operation of the output booster amplifier.

BRIEF DESCRIPTION OF THE DRAWINGS

The present invention will now be described in further details with reference to the accompanying figures, wherein.

While the invention is susceptible to various modifications and alternative forms specific embodiments have been shown by way of examples in the drawings and will be described in details herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE INVENTION

In its broadest aspect the present invention relates to an amplifier circuit having a frequency response which is essentially unaffected by a signal level arriving at an input amplifier stage of the amplifier circuit. The amplifier circuit may have a filter stage incorporated therein. The amplifier circuit is implemented in such a way that the filter stage is essentially unaffected by a signal level being provided to an input amplifier stage of the amplifier circuit. The amplifier circuit of the present invention is of the type two wire self-biasing output booster amplifier.

Figure 1:
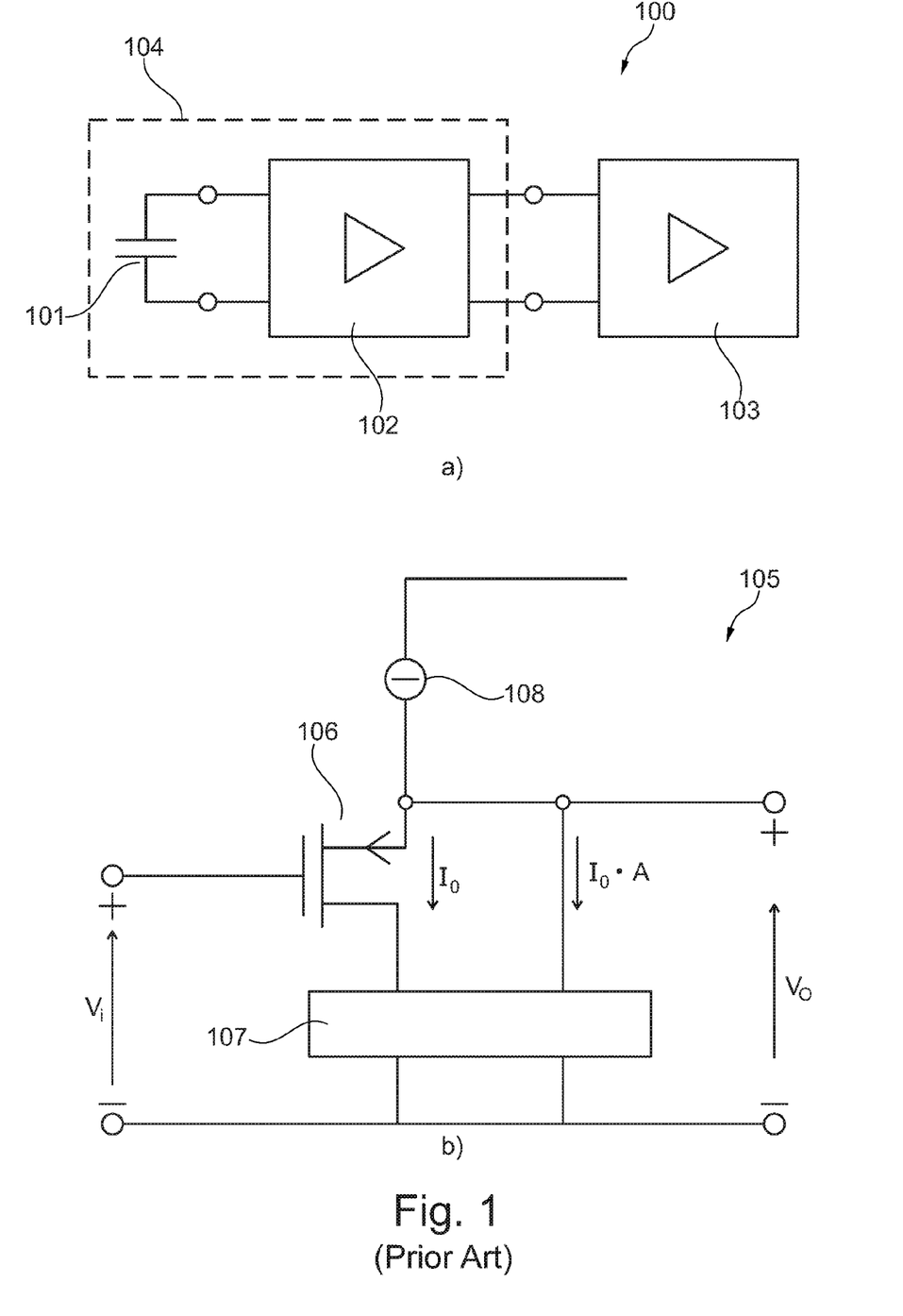
FIG. 1 shows in a) a block schematic of a microphone and a digital signal processor (DSP), and in b) a high level circuit diagram according to the prior art.

Referring now to FIG. 1a a prior art arrangement 100 comprising a microphone 104 and a DSP 103 is depicted. Such arrangements are typically applied in hearing devices. As seen in FIG. 1a the microphone 104 comprises a microphone cartridge 101 and a two wire amplifier 102 being connected thereto. The microphone cartridge 101 may be a micro electro-mechanical system (MEMS) cartridge or an electret cartridge whereas the amplifier 102 is a two wire self-biasing output booster amplifier. It should be noted that the microphone cartridge 101 may in principle be any kind of sensor.

FIG. 1b shows a prior art high level circuit diagram 105 of a two wire self-biasing output booster amplifier. As seen the two wire self-biasing output booster amplifier is adapted to receive an input signal, $V_i$, at its second stage source follower 106. The second stage is adapted to generate an output signal $V_O$. The total output current is the sum of $I_0$ and $A \cdot I_0$ where A is the gain of the current copying circuit 107 of the two wire self-biasing output booster amplifier. This current copying circuit 107 facilitates that the current $I_0$ can be maintained at a relative low current level. This ensures that the source follower 106 has a more linear behaviour. FIG. 1b also shows DSP biasing device 108.

Figure 2:
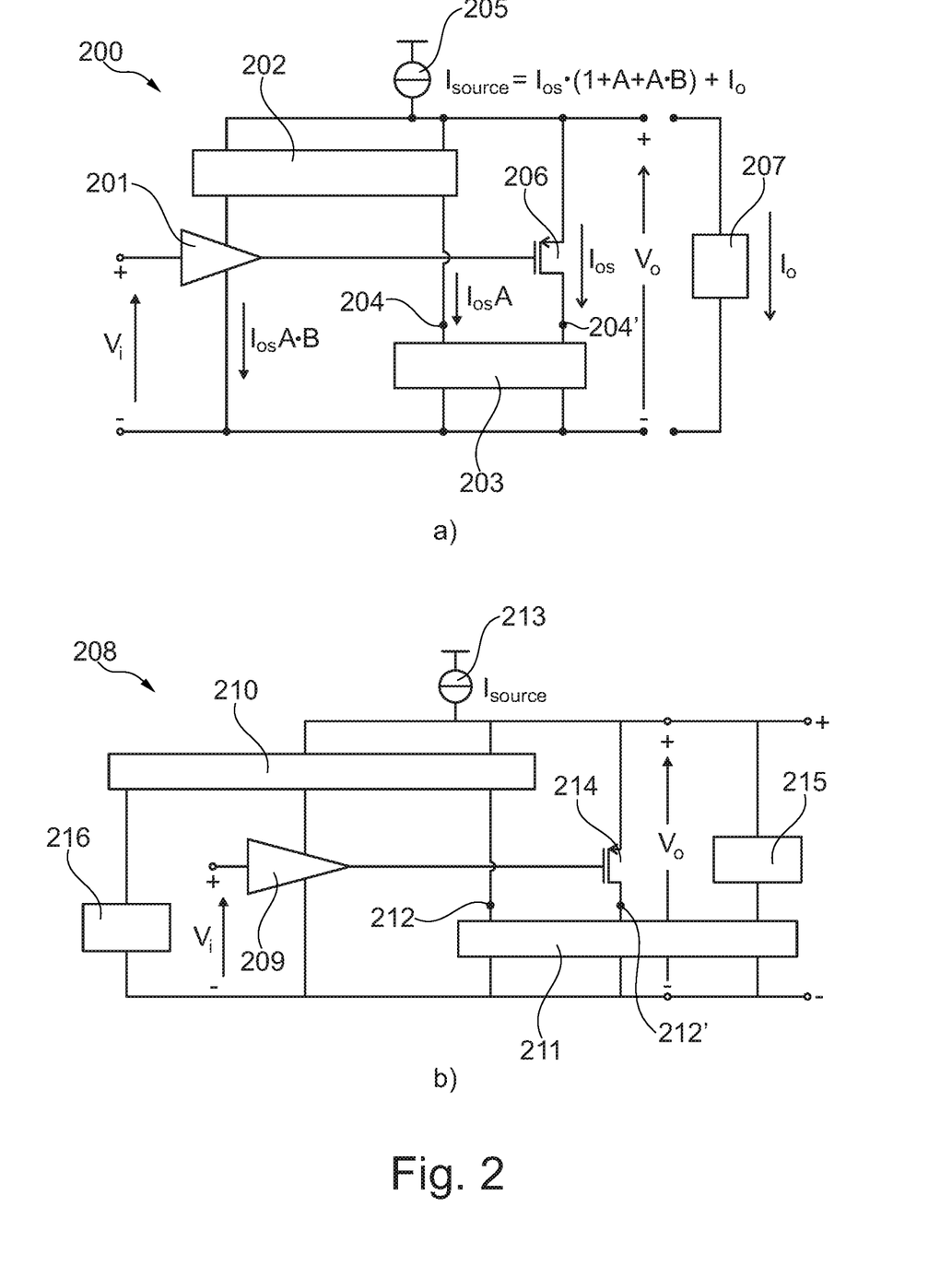
FIG. 2 shows high level circuit diagrams and a circuit schematic of a two-wire self-biasing output booster amplifier according to the present invention.

FIGS. 2a and 2b both show high level circuit diaphragms 200, 208 of a two-wire self-biasing output booster amplifier of the present invention. As seen in FIG. 2a the two wire self-biasing output booster amplifier is adapted to receive an input signal, $V_i$, at its input stage 201 which is configured as a source follower stage. The two wire self-biasing output booster amplifier further comprises an output stage comprising a transistor 206 which also acts as a source follower stage and thereby steers the output node with the desired output signal level. The output stage is adapted to generate an output signal $V_O$. The total output current is the sum of $I_{OS} \cdot (A \cdot B)$, $I_{OS} \cdot A$ and $I_0$ where A and B are the respective gain ratios of the first and second current copying circuits of the two wire self-biasing output booster amplifier. The two current copying circuits 202, 203 facilitate that the current $I_0$ can be maintained at a relative low current level. This ensures that the source follower 201 has a more linear behaviour. A load 207 and a current source 205 are depicted as well. The current source 205 provides an output current, $I_{source}$, of $I_{OS} \cdot (1+A+A \cdot B)+I_O$. The bias negative feedback path is captured in the relation $I_{source}=I_{OS} \cdot (1+A+A \cdot B)+I_O$ each bias current in the self-biasing output booster amplifier is balanced to this current relation. In FIG. 2a the node 204 is the input of the current copying circuit 203, whereas node 204' is the output of the current copying circuit.

FIG. 2b also shows a two wire self-biasing output booster amplifier 208 adapted to receive an input signal, $V_i$, at its input stage 209 which is configured as a source follower stage. Similar to FIG. 2a the input stage 209 is operatively coupled to an output stage comprising a transistor 214 which also acts as a source follower. The two wire self-biasing output booster amplifier further comprises two current copying circuits 210, 211 as well as two additional circuits 215, 216. The two additional circuits 215, 216 are adapted to be biased from the current copying circuits 211 and 201 respectively. The additional circuits 215, 216 can perform various functions including, but not limited to readout circuits for other types of sensors, charge pump step up/down converter, memory blocks etc. In FIG. 2b the node 212' is the input of the current copying circuit 211, whereas node 212 is the output of the current copying circuit 211.

FIG. 2c shows an example of a circuit diagram 217 of a two wire self-biasing output booster amplifier. The filter and transistor-related implementations mentioned below are to be considered as non-limiting examples. In FIG. 2c a PMOS transistor 218 is used as a source follower stage to buffer the input signal 219 from a membrane of the microphone cartridge before reaching the optional high-pass filter stage 220. Alternatively, the PMOS transistor 218 may also form part of another type of amplifier stage. Also, the high-pass filter stage 220 may be replaced by a low-pass filter or a notch filter.

The high-pass filter stage 220 comprises a capacitor 221 and a resistor 222. The cut-off frequency of the high-pass filter will typically be in the frequency range 20-300 Hz.

The two wire self-biasing output booster amplifier further comprises an output stage comprising a transistor 223 and resistor 224. The transistor 223 acts as a source follower stage and thereby steers the output node with the desired output signal level. The resistor 224 acts as a bias level shift to increase the Vdcout level 225. The resistance of the resistor 224 may typically be set to be between 0Ω (no resistor present) to around 100 kΩ—the upper limit being set in view of noise considerations. With an increase in the Vdcout level 225 the input overload margin of the input amplifier stage increases accordingly. Moreover, the output impedance of the amplifier is more constant as a function of signal levels, which result in a more constant low-pass filter frequency. A low-pass filter (not shown) in the form of a capacitor being directly connected between the output 225 and ground node 230 would normally also be provided. This capacitor is normally is in the range of 1 pF to 20 nF.

The self-biasing output booster amplifier circuit is implemented using a current mirror feedback loop via transistors 226, 227, 228, 229. These transistors are arranged in such a manner that the currents in all three branches of the amplifier circuit are steered by input signal. The feedback loop ensures that the ratio between the DC biasing and any AC signal current in all three branches of the amplifier circuit is fixed. The gain from the input 219 to the output 225 is mainly given by the output stage source follower gain, i.e. transistor 223 and resistor 224. The output current of the output stage source follower is copied to ensure that the current in the other two branches including transistor 227 and 228 follows the output current, i.e. boosting the total output current.

Moreover, the branch including transistor 223 carries a smaller portion of the total output signal current due to the current copy via the other branches containing transistor 227 and 228. This smaller current portion makes the transistor 223 behave more linear.

It should be noted that by replacing the resistor 222 in the high-pass filter stage 220 with a capacitor and an antiparallel diode network the high-pass filter function can be removed. The gain curve will then not have a high-pass filter characteristic. Instead the response will ideally be flat in the frequency range between 20 Hz and 1 kHz.

Figure 3:
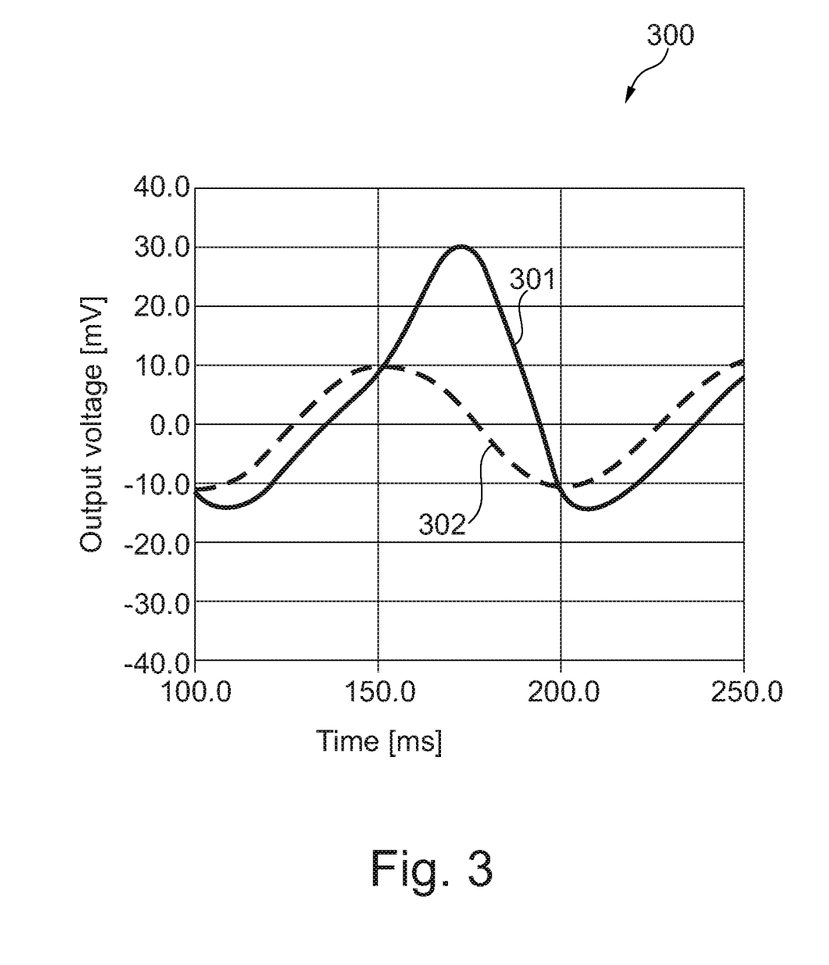
FIG. 3 shows a comparison between 10 Hz transient simulation results.

A comparison of the response of the two wire self-biasing output booster amplifier of the present invention and a typical prior art circuit is shown in FIG. 3.

As seen in FIG. 3 the main difference between the prior art circuit and the amplifier of the present invention is the stability of the high-pass filter frequency versus signal input level. The simulation results 300 shown in FIG. 3 show the output signal levels 301, 302 in response to an input signal level of 100 mV root mean square (RMS) at 10 Hz. As seen in FIG. 3 the positive side of the output signal 301 from the prior circuit is not attenuated. Contrary to this, the two wire self-biasing output booster amplifier of the present invention does attenuate the low frequency input signal, cf. curve 302 in FIG. 3. Thus, the two wire self-biasing output booster amplifier of the present invention is a significant improvement compared to typical prior art circuits as it prevents high and distorted output signals due to for example a door slam.

Figure 4:
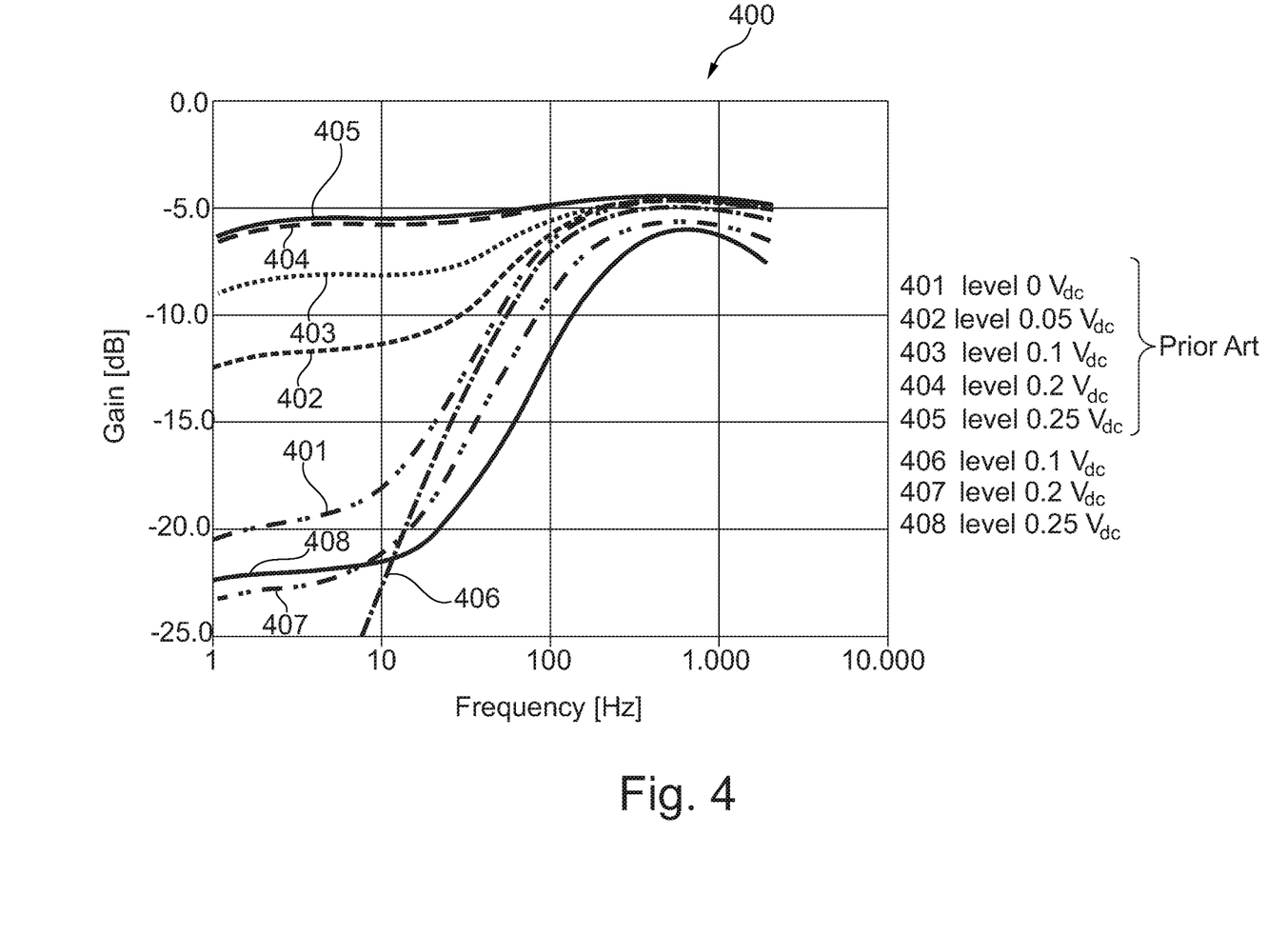
FIG. 4 shows a comparison between gain simulation results.

Another way to look at the high-pass filter response is to consider an AC gain simulation result at different voltage bias levels of the first amplifier stage PMOS transistor 201, cf. FIG. 2. In FIG. 4 the AC frequency responses of the prior art circuit 401-405 and the amplifier of the present 406-407 are shown. The input DC bias level, gate voltage of the PMOS transistor 201, is varied from +0 V to +250 mV in order to represent different transient signal levels. The simulated AC gain results confirm that the filter of the prior art circuit does not attenuate the positive side of the input signal at low frequencies.

Figure 5:
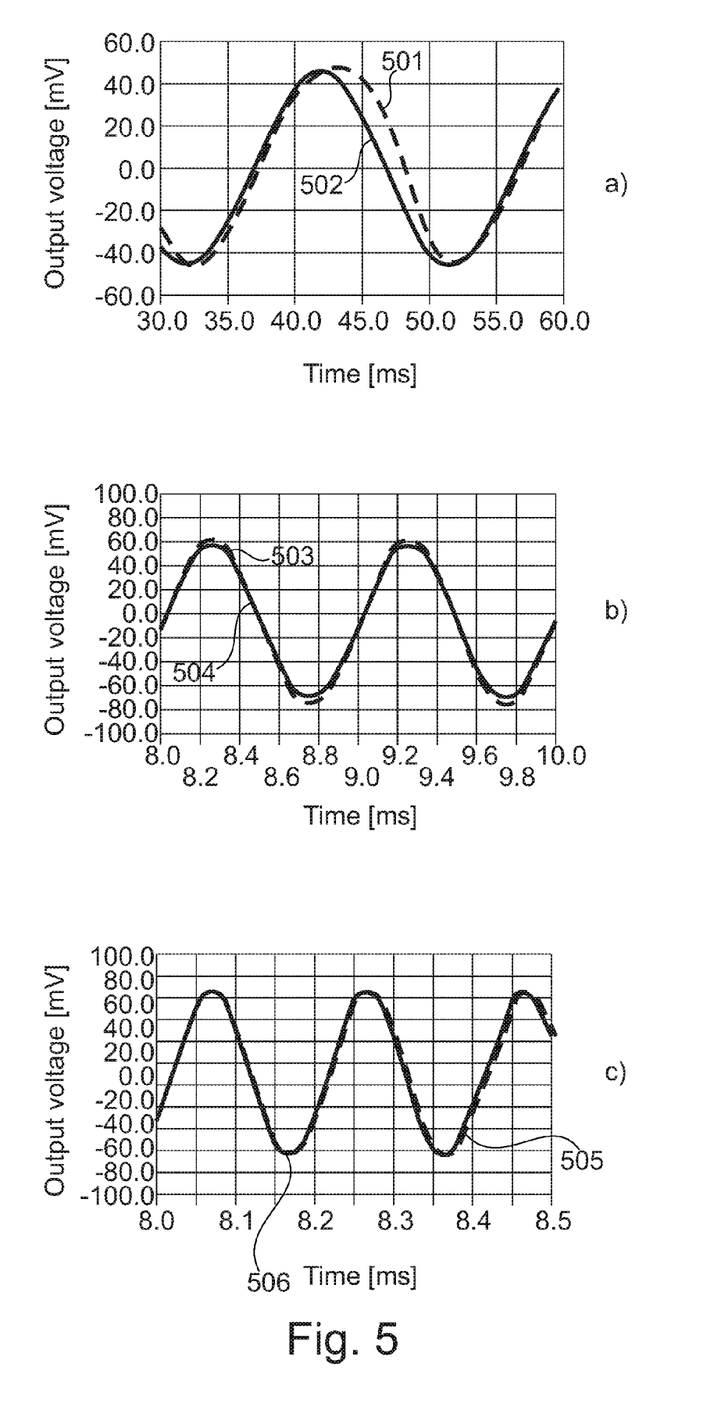
FIG. 5 shows comparisons between 50 Hz, 1 kHz and 5 kHz transient simulation results.

FIG. 5 shows a comparison between several other frequencies. The three pairs of simulation curves 500 show the differences in the signal level transient responses and the total harmonic distortion (THD) level at the following different frequencies:

1) FIG. 5*a*: input signal level 100 mV RMS, 50 Hz,
2) FIG. 5*b*: input signal level 100 mV RMS, 1 kHz, and
3) FIG. 5*c*: input signal level 100 mV RMS, 5 kHz.

The above-mentioned input signal levels are applied to both a typical prior art circuit and the amplifier circuit of the present invention.

In FIG. 5*a* the THDs of the prior circuit and the circuit of the present invention are higher than 10% and lower than 1%, respectively. The prior art response curve is denoted 501, whereas the response curve of the amplifier circuit of the present invention is denoted 502.

In FIG. 5*b* the THDs of the prior art circuit and the circuit of the present invention are both in the range of 0.25-1%. The prior art response curve is denoted 503, whereas the response curve of the amplifier circuit of the present invention is denoted 504.

In FIG. 5*c* the THDs of the prior art circuit and the circuit of the present invention are both in the range of 1.5-2.5%. The prior art response curve is denoted 505, whereas the response curve of the amplifier circuit of the present invention is denoted 506. As seen the two curves are highly overlapping.

In conclusion, for mid (1 kHz) and high (5 kHz) frequencies the THD levels of the two circuits are comparable. For the 50 Hz input signal the responses from the two circuits 501, 502 are clearly different. However, it should be noted that the THD's levels may vary with the exact circuit topology applied.

Another advantageous feature of the amplifier circuit of the present invention relates to the fact that amplifier circuit is capable of operating using a wide range of DC bias current. In fact the amplifier circuit of the present invention is capable of handling DC bias currents ranging from 5 μA to 20 μA while maintaining an essential constant AC response and low THD levels, cf. FIG. 6.

Figure 6:
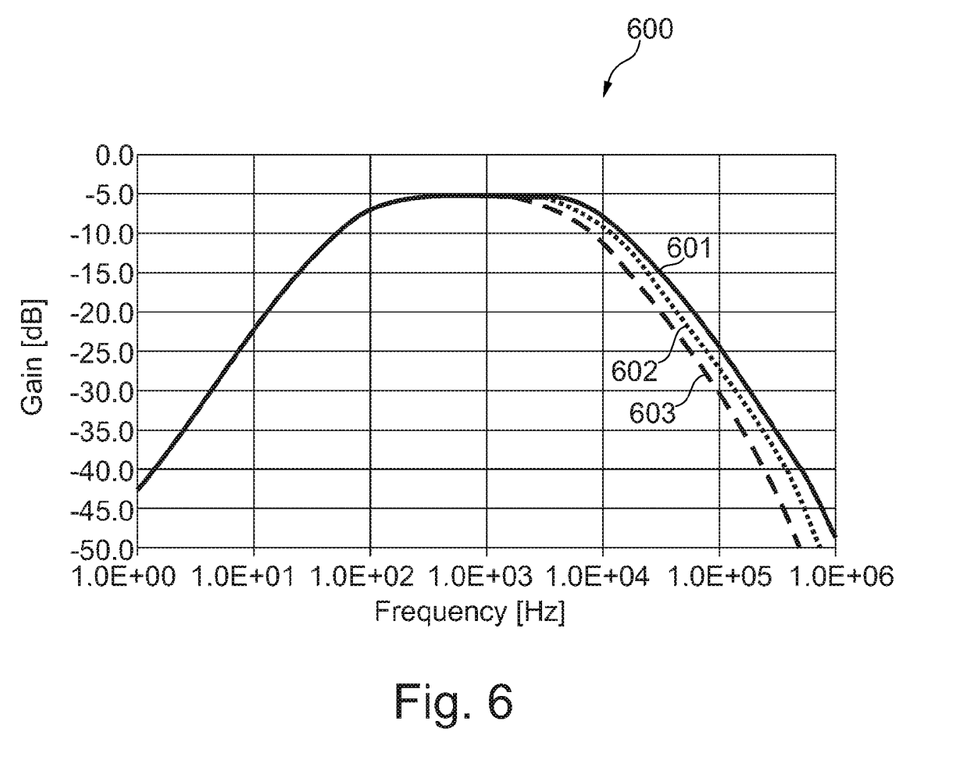
FIG. 6 shows AC gains for various DC bias currents.

In FIG. 6 the gain is simulated for the following three DC bias current:

1) Response curve 601: 20 μA
2) Response curve 602: 10 μA
3) Response curve 603: 5 μA The input signal frequency is swept between 1 kHz and 1 MHz. As seen in FIG. 6 the high frequency roll-off shifts to higher frequencies when the DC bias current increases. This is due to a decrease of the high frequency output impedance. The decreased high frequency output impedance can also be used to move or shift the high frequency response.

The self-biasing output booster amplifier of the present invention may be used in various applications. In case of directional microphone systems for use in a hearing device it would be beneficial to have a microphone module which not only has the regular (either front/rear/directional) microphone outputs but also has an output signal node where a dual omni-directional signal is available. By incorporating a summing functionality into the microphone module the generation of the dual omni-directional signal may be performed close to the first amplifier stage in the signal chain. This is advantageous due to an improved SNR compared to adding the signals inside the DSP which is several amplifier stages down the signal stage.

To provide the above-mentioned functionality within a microphone module a circuit that buffers and sums two electrical signals coming from two microphone membranes is required. The main feature of such a new buffering and summing circuit would be to generate a summed signal from two inputs signals V(A) and V(B) using the following relation:

$$V(\text{out}) = G_{amp1} V(A) + G_{amp2} V(B)$$

or $$V(\text{out}) = G_{amp}(V(A) + V(B))$$

if the gains, $G_{amp}$, of the amplifiers are equal. Otherwise $G_{amp1}$ and $G_{amp2}$ are the gains of the respective amplifiers.

Figure 7:
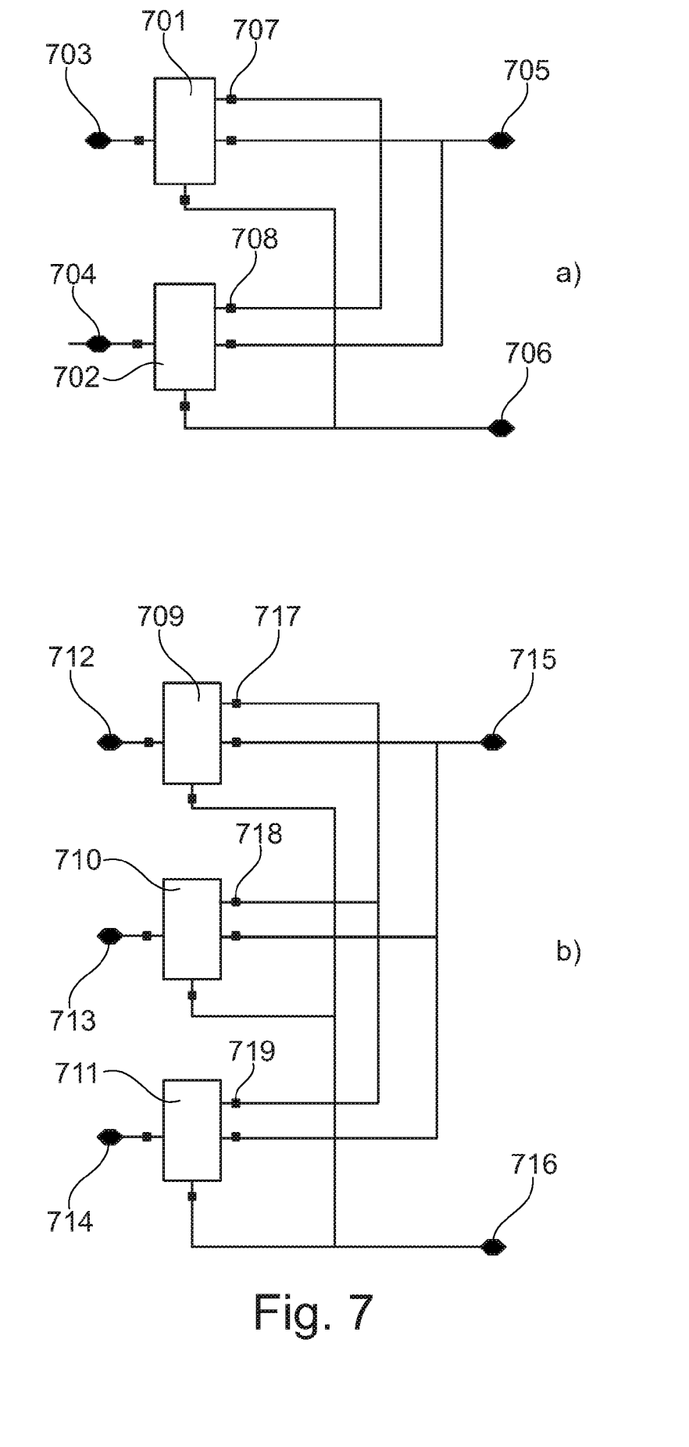
FIG. 7 shows two buffering and summing circuits.

A suitable buffering and summing circuit is depicted in FIG. 7 where each of amplifiers 701, 702 are identical to the self-biasing output booster amplifier shown in FIG. 2. As seen in FIG. 7*a* each of the amplifiers 701, 702 receive respective input signals 703, 704. The output signal 705 is provided by combining the output signal from each of amplifiers 701, 702. The two ground nodes are connected as well to form a common ground node 706. The buffering and summing circuit shown in FIG. 7*a* may be implemented as an application specific integrated circuit (ASIC). It should be noted that any electrostatic discharge (ESD) protection and/or low-pass filter capacitors are not shown in FIG. 7*a*.

Still referring to FIG. 7*a* the two amplifiers 701, 702 amplify the signals arriving at input nodes 703, 704. These signals may originate from two microphone membranes (not shown). Alternative, a microphone membrane may be connected to one input node 703 whereas for example a telecoil is connected to the other input node 704. Optionally a switching circuit can be added to select either the microphone membrane or the telecoil. The advantage would be to reduce the click and pop noises while switching to and/or from telecoil mode.

The two input nodes 703, 704 could also be connected to the same microphone membrane. In this scenario a high gain signal path and a low gain signal path may be provided through the respective amplifiers 701, 702. This allows that either the high gain signal path or the low gain signal path may be selected. An advantage associated with such as arrangement would be to have a more click and pop free audio signal during switching between the high and the low gain mode of operation.

As already addressed the amplifiers 701, 702 are of the type two wire self-biasing output booster amplifier, cf. FIG. 2.

Figure 10:
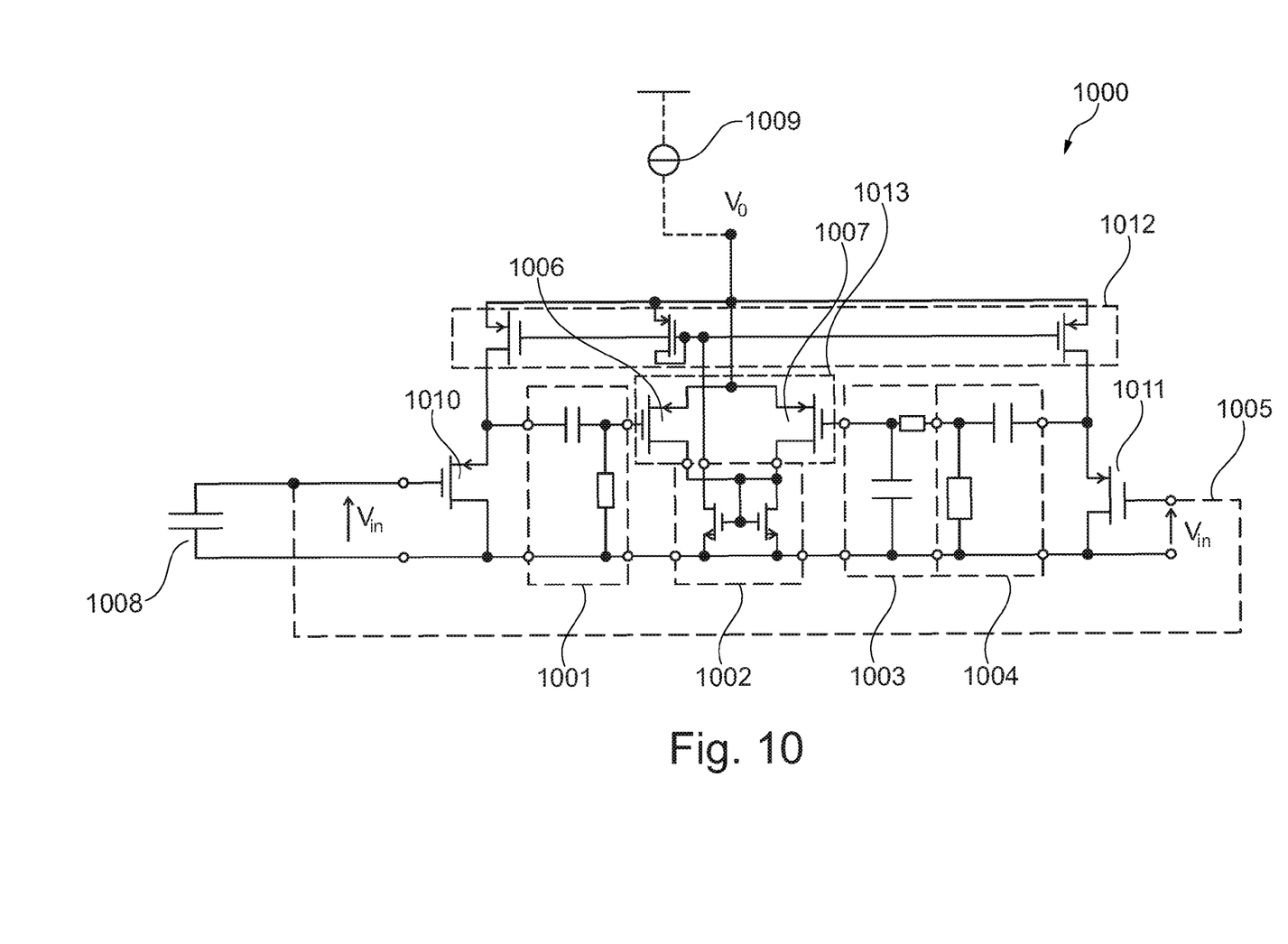
FIG. 10 shows a summing circuit in combination with a high-pass filter and a notch filter.

One way to arrive at the desired buffering and summing, the nodes 707, 708 of the amplifiers 701, 702 need to be connected. The nodes 707, 708 going internally into the respective amplifiers 701, 702 are connected to either node 204, 204', 212 or 212' of the current copying circuits 203, 211 of FIGS. 2*a* and 2*b*. Nodes 204 and 212' are the inputs of the current copying circuit 203, 211, respectively, whereas nodes 204' and 212 are the outputs of the current copying circuit 203, 211, respectively. The resulting ASIC has one output node 705, one ground node 706 and two input nodes 703, 704. Another approach is depicted in FIG. 10.

In the buffering and summing circuit shown in FIG. 7*a* the signal gain from input nodes 703, 704 to the output node 705 will be mainly determined by the second stage PMOS source follower gain in both amplifiers 701, 702, cf. FIG. 2. This is due to the fact that both PMOS source followers are connected via their respective source nodes. The connected source nodes are connected to the output node 705 and the resulting output voltage signal becomes an attenuated version of the sum of the input signals provided to the input nodes 703, 704. More specifically the output signal at the output node 705 is the sum of the two input signals divided by a factor of two.

Still referring to FIG. 7a the connection via the add nodes 707, 708 enable feedback between the amplifiers DC biasing nodes such that the external current source is split among the two amplifiers 701, 702. The circuits of the amplifiers 701, 702 will provide that the bias currents within the amplifiers 701, 702 are in accordance with a set ratio in the amplifiers 701, 702 respective current mirrors.

The second function of the connection via the add nodes 707 is to sum the AC signal currents resulting from input signals provided at input nodes 703, 704 such that both first and second current copying circuits in both amplifiers 701, 702 can boost the output node 705 with the AC summed signal.

Figure 8:
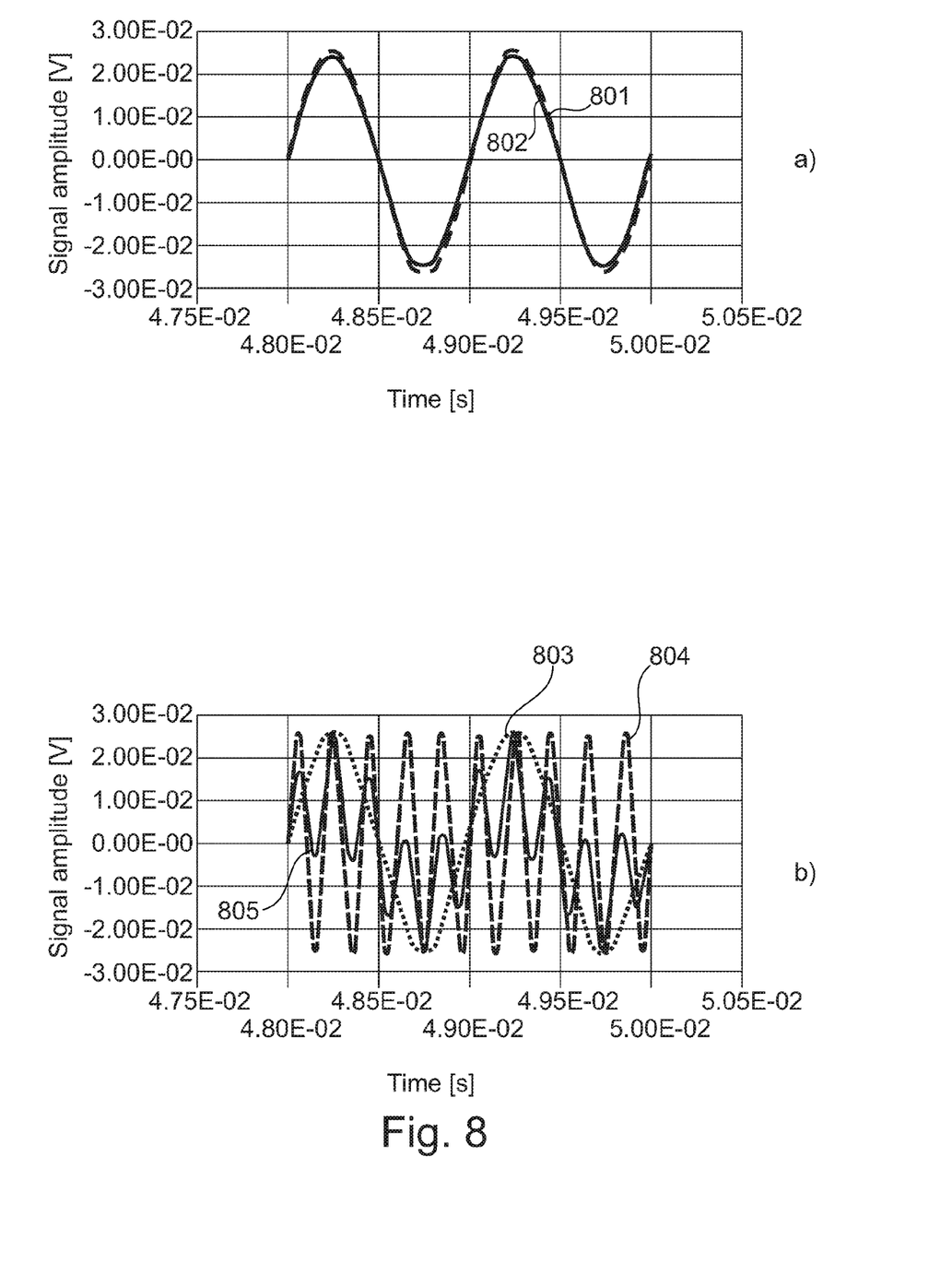
FIG. 8 shows simulation results for a two-input buffering and summing circuit.

FIG. 8a shows the simulated output signal 802 of the buffering and summing circuit shown in FIG. 7a. The input signals applied to the input nodes 703, 704 are two identical 1 kHz signals 801 having an amplitude of 25 mV. FIG. 8b also shows the simulated output signal 805 of the buffering and summing circuit shown in FIG. 7a. The input signals applied to the input nodes 703, 704 are a 1 kHz signal 803 and a 5 kHz signal 804 both having an amplitude of 25 mV.

Returning now to FIG. 7b three amplifiers 709-711 are buffering and summing signals from the three input nodes 712-714. Again, each of the amplifiers 709-711 are of the type two wire self-biasing output booster amplifier, cf. FIG. 2. One way to arrive at the desired buffering and summing the PMOS mirror gate nodes 717-719 of the amplifiers 709-711 can be connected. The output signal is provided between output node 715 and ground node 716. The output signal at the output node 715 is the sum of the three input signals divided by a factor of three.

Figure 9:
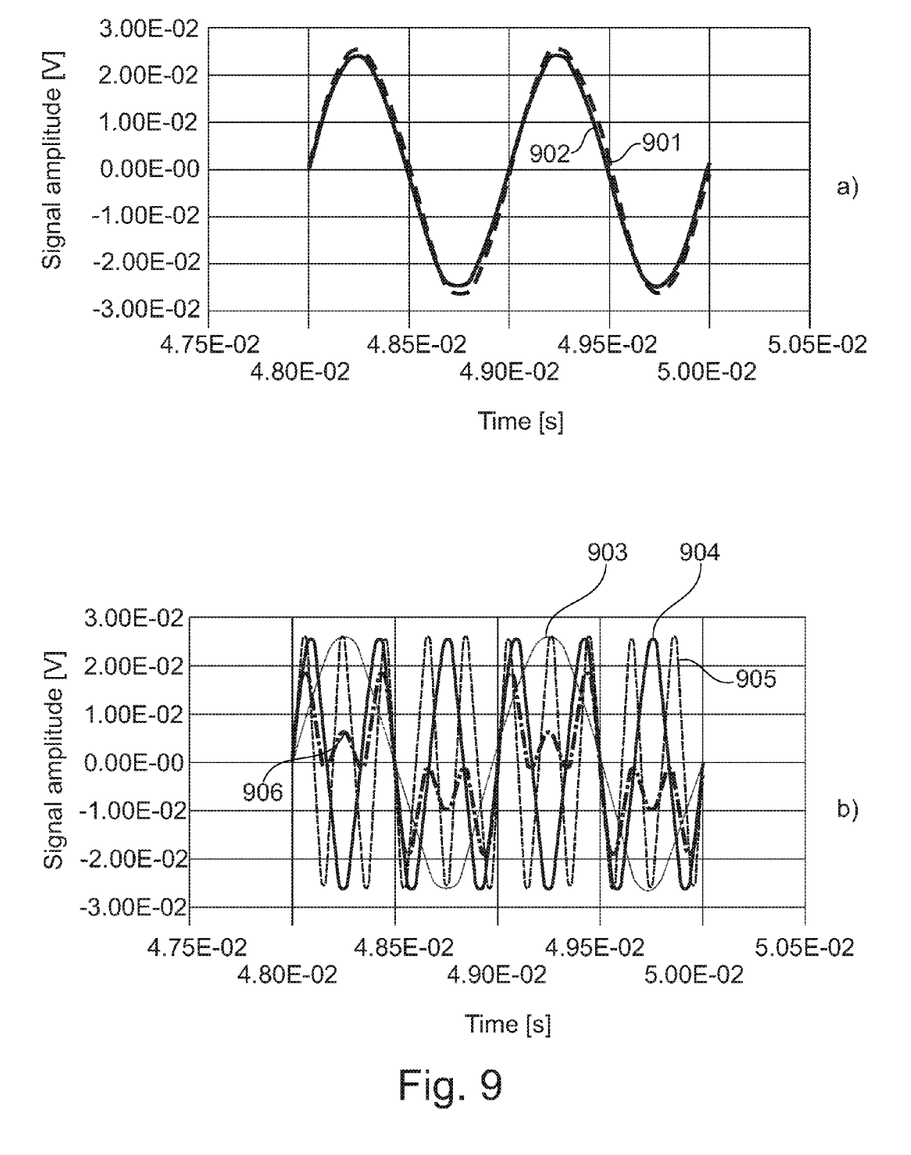
FIG. 9 shows simulation results for a three-input buffering and summing circuit.

FIG. 9a shows the simulated output signal 902 of the buffering and summing circuit shown in FIG. 7b. The input signals applied to the input nodes 712-714 are three identical 1 kHz signals 901 having an amplitude of 30 mV. FIG. 9b also shows the simulated output signal 906 of the buffering and summing circuit shown in FIG. 7b. The input signals applied to the input nodes 712-714 are a 1 kHz signal 903, a 3 kHz signal 904 and a 5 kHz signal 905 all having an amplitude of 30 mV.

Referring now to FIG. 10 another summing circuit 1000 is depicted. In general, the summing circuit 1000 comprises input amplifier stages 1010, 1011, a high-pass filter 1001, a shared bias source 1002, a low-pass filter 1003 and a high-pass filter 1004. The low-pass filter 1003 and the high-pass filter 1001 form a notch filter in combination. The input signal $V_{in}$ can originate from a microphone cartridge 1008 or another type of sensor. FIG. 10 also shows a DSP biasing device 1009 and booster output amplifier stages 1006, 1007 which may be considered one circuit being denoted 1013. The current mirror 1012 is depicted in the upper part of the summing circuit 1000.

As indicated by the dotted line 1005 the input amplifier stages 1010, 1011 may optionally be connected. Each of the first and second stages processes respective parts of the total frequency range.

Figure 11:
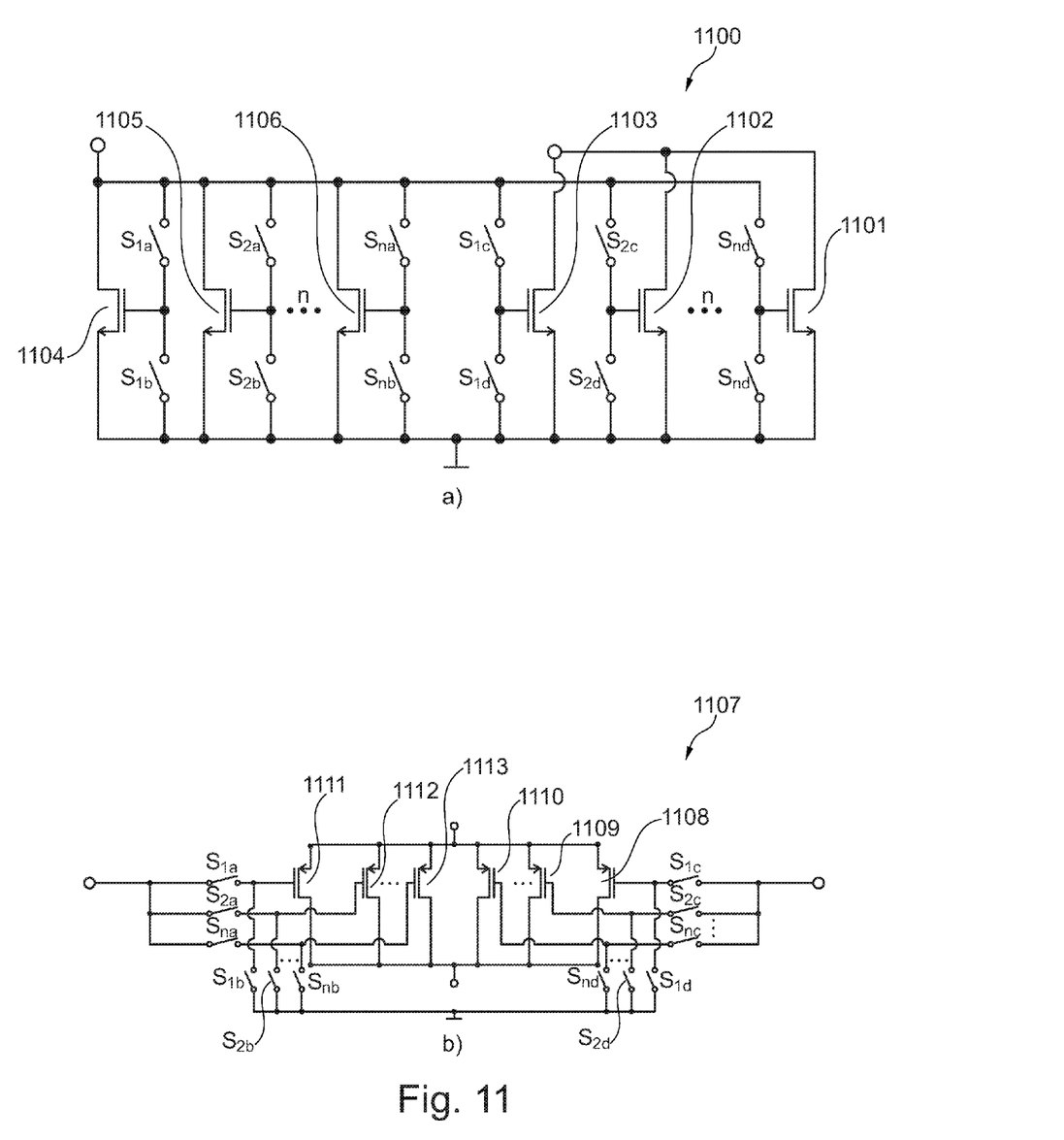
FIG. 11 shows possible implementations of the switching circuits.

Referring now to FIG. 11a an example of an implementation of the shared bias source 1002 is depicted. In FIG. 11a the circuit is denoted 1100. As seen in FIG. 11a the shared bias source may be implemented using a plurality of independently controllable switches being denoted $S_{1a}$, $S_{1b}$, $S_{1c}$, $S_{1d}$, $S_{2a}$, $S_{2b}$, $S_{2c}$, $S_{2d}$, $S_{na}$, $S_{nb}$, $S_{nc}$ and $S_{nd}$. The controllable switches are grouped in four groups, a to d, with n switches in each group. Appropriate switching control signals may be generated by the DSP or another switch control circuit internal or external to the microphone unit. The switch control signals can change the ratio of the current sources by disconnecting and/or grounding gates of output amplifier stages 1101-1106 of the shared bias source. By shifting the ratio of the current sources the Vdcout output voltage level may be changed. The independently controllable switches may be set by hard-wiring beforehand, or they may be independently controlled on-the-fly, i.e. during operation of the circuit.

Referring now to FIG. 11b an example of an implementation of the booster output amplifier stage 1013 is depicted. In FIG. 11b the circuit is denoted 1107. As seen in FIG. 11b the booster output amplifier stages may also be implemented using a plurality of independently controllable switches being denoted $S_{1a}$, $S_{1b}$, $S_{1c}$, $S_{1d}$, $S_{2a}$, $S_{2b}$, $S_{2c}$, $S_{2d}$, $S_{na}$, $S_{nb}$, $S_{nc}$ and $S_{nd}$. The controllable switches are grouped in four groups, a to d, with n switches in each group. Similar to the shared bias source depicted in FIG. 11a appropriate switching control signals may be generated by the DSP or another switch control circuit internal or external to the microphone unit. By switching a number of gates in the booster circuit 1006, i.e. output amplifier stages 1111-1113, relative to the booster circuit 1007, i.e. output amplifier stages 1108-1110, the ratio between the respective gains, $G_{amp1}$ and $G_{amp2}$, may be varied. For noise reasons the maximum achievable gain ratio is around 1:25 at an operating voltage level of around 1 V. Similar to the shared bias source the independently controllable switches in FIG. 11b may be set by hard-wiring beforehand, or they may be independently controlled on-the-fly, i.e. during operation of the circuit.

The invention claimed is:

1. A self-biasing output booster amplifier comprising
an input amplifier stage,
an output amplifier stage being operatively connected to an output of the input amplifier stage, and
first and second current copying circuits, wherein the second current copying circuit is biased from an output of the self-biasing output booster amplifier
wherein the first and second current copying circuits are configured to copy at least a portion of the current through the output amplifier stage, and
wherein the sum of the output of the second current copying circuit and the output of the output amplifier stage provides the output current of the self-biasing output booster amplifier, and
wherein the input amplifier stage is biased from the output of the second current copying circuits.

2. A self-biasing output booster amplifier according to claim 1, wherein the first and second current copying circuits are configured to copy the total current through the output amplifier stage.

3. A self-biasing output booster amplifier according to claim 1, wherein the input amplifier stage is fully biased from the output of the second current copying.

4. A self-biasing output booster amplifier according to claim 1, further comprising a power supply comprising a bias current source.

5. A self-biasing output booster amplifier according to claim 1, wherein the output amplifier stage comprises a source follower.

6. A self-biasing output booster amplifier according to claim 5, wherein the first current copying circuit comprises a current mirror circuit for sensing a drain current from the source follower of the output amplifier stage.

7. A self-biasing output booster amplifier according to claim 1, wherein the input amplifier stage is configured to receive a signal from an associated sensor.

8. A self-biasing output booster amplifier according to claim 7, wherein the signal from an associated sensor comprises a signal from a microphone membrane.

9. A self-biasing output booster amplifier according to claim 8, further comprising a filter stage adapted to filter signals from the input amplifier stage.

10. A self-biasing output booster amplifier according to claim 9, wherein the filter stage comprises a high-pass filter, a low-pass filter, a band-pass filter or a notch filter.

11. A self-biasing output booster amplifier according to claim 8, wherein the input amplifier stage comprises at least one transistor being adapted to be operated as a source follower stage in order to buffer a signal from the associated sensor.

12. A self-biasing output booster amplifier according to claim 1, wherein the output amplifier stage further comprises a voltage level shifting arrangement.

13. A summing circuit for processing signals from at least two associated sensors, said summing circuit comprising a plurality of self-biasing output booster amplifiers according to claim 1.

14. A summing circuit according to claim 13, wherein the number of self-biasing output booster amplifiers is less than 10, less than 8 or less than 6.

15. A sensor module comprising at least one summing circuit according to claim 13 and at least two sensors being operatively connected thereto.

16. A sensor module according to claim 15, wherein the at least two sensors comprise microphone units, telecoils or vibrations sensors.

17. A microphone module comprising at least one summing circuit according to claim 13 and at least two microphone cartridges being operatively connected thereto.

18. A microphone module according to claim 17, wherein the at least two microphone cartridge each comprises a MEMS cartridge or an electret cartridge.

19. A personal assisting device comprising a sensor module according to claim 15, said personal assisting device comprising a hearing aid.

20. A personal assisting device according to claim 19, wherein the hearing air comprises a behind-the-ear hearing aid, an in-the-ear hearing aid, an in-the-canal hearing aid or a completely-in-the-canal hearing aid.

* * * * *